United States Patent [19]
Bilodeau et al.

[11] Patent Number: 5,465,152
[45] Date of Patent: Nov. 7, 1995

[54] METHOD FOR COPLANARITY INSPECTION OF PACKAGE OR SUBSTRATE WARPAGE FOR BALL GRID ARRAYS, COLUMN ARRAYS, AND SIMILAR STRUCTURES

[75] Inventors: Steve Bilodeau, Setauket; Frank Jacovino, Plainview; Joanne Cameron, Oakdale; James Cain, Calverton, all of N.Y.

[73] Assignee: Robotic Vision Systems, Inc., Hauppauge, N.Y.

[21] Appl. No.: 253,989

[22] Filed: Jun. 3, 1994

[51] Int. Cl.⁶ .................................................. G01B 11/00
[52] U.S. Cl. ............................................ 356/371; 356/237
[58] Field of Search .................................. 356/376, 371, 356/237

[56] References Cited

FOREIGN PATENT DOCUMENTS 3210410  9/1991  Japan ........................................ 356/376

OTHER PUBLICATIONS

Cammarano et al "Optical Testing of Solder Pads" *IBM Technical Disclosure Bulletin*, vol. 21, No. 7, Dec. 1978, pp. 2914-29-15.

*Primary Examiner*—Richard A. Rosenberger
*Attorney, Agent, or Firm*—Max Fogiel

[57] ABSTRACT

A method for determining coplanarity with 3-D sensing means of substrates for ball grid array, column grid array, and similar surface mount integrated circuit chips, in which opaque fiducials are provided as index pads. Heights of the index pads are correlated with signal pad heights in a neighborhood about the index pads. The index pads are opaque to incident radiation from the 3-D sensor. The index pads reflect sufficient radiation to be detected easily by the 3-D sensor. The index pads are disposed in a prearranged pattern over a domain of ball grid array signal pads. The index pads are restricted to a predetermined range of heights.

12 Claims, 14 Drawing Sheets

○ = ball
⊖ = no ball, pad only

*Figure 8*

○ = ball
⊜ = no ball, pad only

METHOD FOR COPLANARITY INSPECTION OF PACKAGE OR SUBSTRATE WARPAGE FOR BALL GRID ARRAYS, COLUMN ARRAYS, AND SIMILAR STRUCTURES

BACKGROUND OF THE INVENTION

As semiconductor chips increase in complexity, the need arises for an increased number of inputs and outputs. The result has been the development of new semiconductor packages such as the ball grid array (bga), the column grid array (cga) and similar structures which have large numbers of contacts.

There is a need for reliable, robust connections between each chip contact and the corresponding pad on the printed circuit board to which it is attached. Direct visual inspection of soldered contacts is impossible after assembly because the contacts are sandwiched between the board and the chip. Even if a defect is detected by such means as x-ray imaging, chip removal from a printed wire board is difficult and removed chips are not generally reusable.

Consider an individual chip with multiple leads which takes the form of an array of solder balls as shown in FIG. 1. Generally, if this chip is placed on a flat surface, such as a printed wiring board (PWB), only three balls will make contact with the board (three points define a plane). The particular three balls in contact depend on the chip mass distribution, the individual ball heights, and other parameters. Other balls may contact or nearly contact the PWB surface depending on chip tolerances in the size of the balls and flatness of the chip among other things. The closer to the surface all the balls are, the more reliable the interconnection of all the leads once the solder has been reflowed. The separation between the ball tips and the flat surface is referred to as coplanarity. The magnitude of the coplanarity parameter is a predictor of how well chip leads can be accurately and reliably soldered to their corresponding pads on a printed circuit board and as a diagnostic for determining when the elements of the package fabrication process are going out of control.

Coplanarity is generally measured optically since mechanical measurements can not be made with the necessary speed and accuracy. Three dimensional vision techniques, which yield values of surface height as a function of surface position, are preferred for inspection or statistical process control. There are a number of potential problems associated with optical measurement of coplanarity, however. When optical techniques are applied to the measurement of bga and cga substrates, erroneous results can result. The substrate material is generally a bismaleimide triazine (BT) epoxy laminate which is partially transparent or translucent at wavelengths used by three dimensional vision equipment and reveals embedded conductive lines and surfaces within the layer. These embedded elements can be mistakenly interpreted by the three dimensional vision system as defining the surface height. Since the geometry of the embedded elements is often proprietary to the semiconductor manufacturers who created it, the vision system can not even be pretaught to disregard particular data points.

SUMMARY OF THE INVENTION

This invention provides a method and means of accurately and repeatably determining the substrate coplanarity contribution. The invention is intended primarily for use with 3-dimensional (3-D) optical vision systems. The invention involves the use of an array of opaque index pads whose top surfaces provide a good measure of the surface height of the pads to which the bga balls or cga column grids are bonded.

OBJECT OF THE INVENTION

The object of this invention is to provide a practical and reliable means of determining the coplanarity of a bga, cga, or similar chip substrate. A further object of the invention is to provide a means of monitoring contributions to coplanarity from both substrate and ball (column).

BRIEF DESCRIPTION OF THE DRAWINGS

FIG. 1b shows a front view of the grid array in FIG. 1a.

DESCRIPTION OF THE INVENTION

FIG. 1 schematically shows top and side views of a hypothetical 3×3 ball grid array (bga). It is understood that ball grid array Integrate Circuit Packages generally have more solder ball contacts than indicated here with more than 700 being reported for particular chips in the technical literature and that they need not be oriented in a square matrix. The simplified diagram shown will serve to illustrate the principles. Furthermore, the same principles of the invention apply to column grid arrays (cga), in which solder columns are substituted for the solder balls shown. Also, the invention applies to any similar structure using a regular geometrical solid solder form and arranged in an array format. That said, the invention will be described in terms of bga's with application to the other structures being an obvious extension.

Figure 1A:
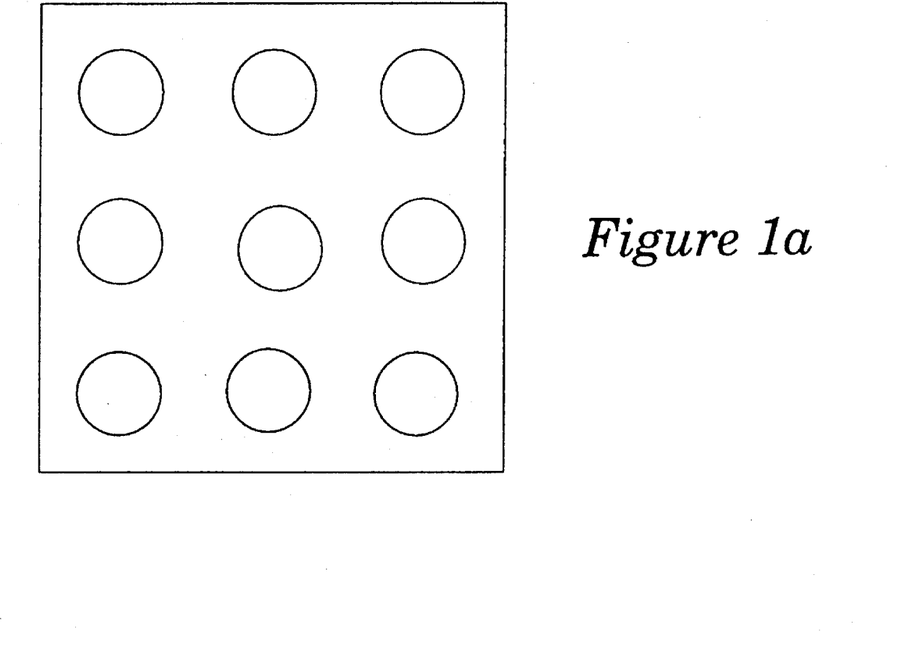
FIG. 1a shows plan view of an idealized 3×3 ball grid array.
Figure 1B:
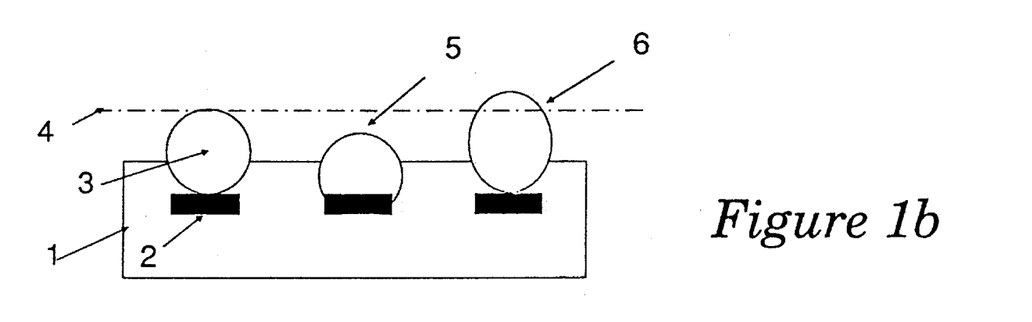

In one form of bga, the substrate (1) comprises a BT epoxy laminate containing a number of copper-foil pads (2) which are connected to an integrated circuit chip by through hole vias and gold wire bonds (not shown). Solder balls (3) are adhered to the pads (2) by heating until a bond is formed. The balls retain their near-spherical shape during this operation. The bga is surface mounted to a printed circuit board by accurately placing the chip on metal pads connected to conductors on the board and heating until the solder can wet the contacts making a solid bond between the bga and the contacts.

A hypothetical surface (4) is constructed from which the coplanarity, defined as the distance from the tip of the ball to the reference surface, of each of the balls is measured. The simplest surface to develop is a plane but more general surfaces, such as parabolic, elliptical, and other higher order surfaces, can be used. While there are many techniques for determining the location of this surface, one that is commonly used is a least mean square regression analysis. This analysis yields a best fit surface to the height of the tips of the balls. This method yields a surface in which some of the balls (6) lie above and others (5) lie below it. The advantage of using non-planar surface fits is to better describe the surface for use with process control efforts that will attempt to correct deviations from a planar surface.

A second method for defining coplanarity is to be contrasted to the least mean squares method (LMS) just described. This is the seating plane method and yields a surface with all the balls lying on one side of the surface (that is, the coplanarity of all the balls has the same algebraic sign).

Figure 2:
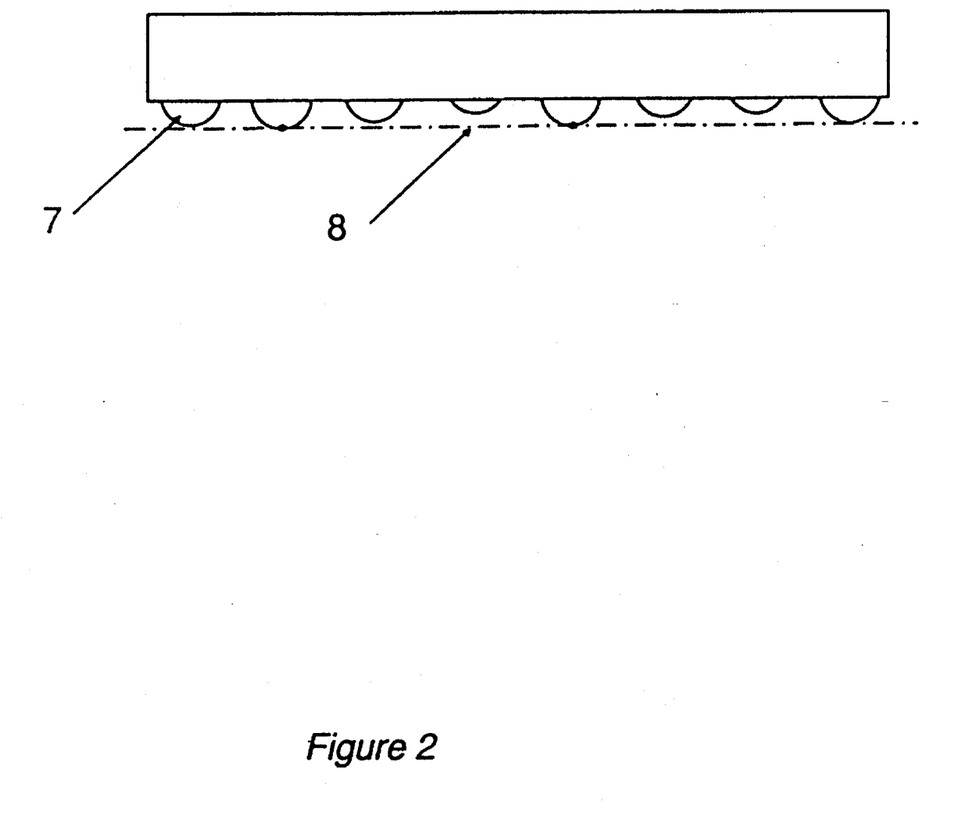
FIG. 2 shows a front view of a bga resting on a seating plane.

In the seating plane method as shown in FIG. 2, the bga is oriented with the balls (7) resting on a reference surface (8), the seating plane. The bga rests on the three or more balls which define a plane. The coplanarity of each ball, using this method, is the distance from the tip of the ball to the seating plane. A complication to the seating plane method concerns stability. The seating plane is stable if the center of mass of the bga is contained within a closed polygon formed with the three or more lowest lying balls as vertices. If the center of mass lies along one of the sides of the polygon or at a vertex, there are two or more stable seating planes and the chip is referred to as a "rocker". In this case the coplanarity can not be uniquely determined.

Figure 3:
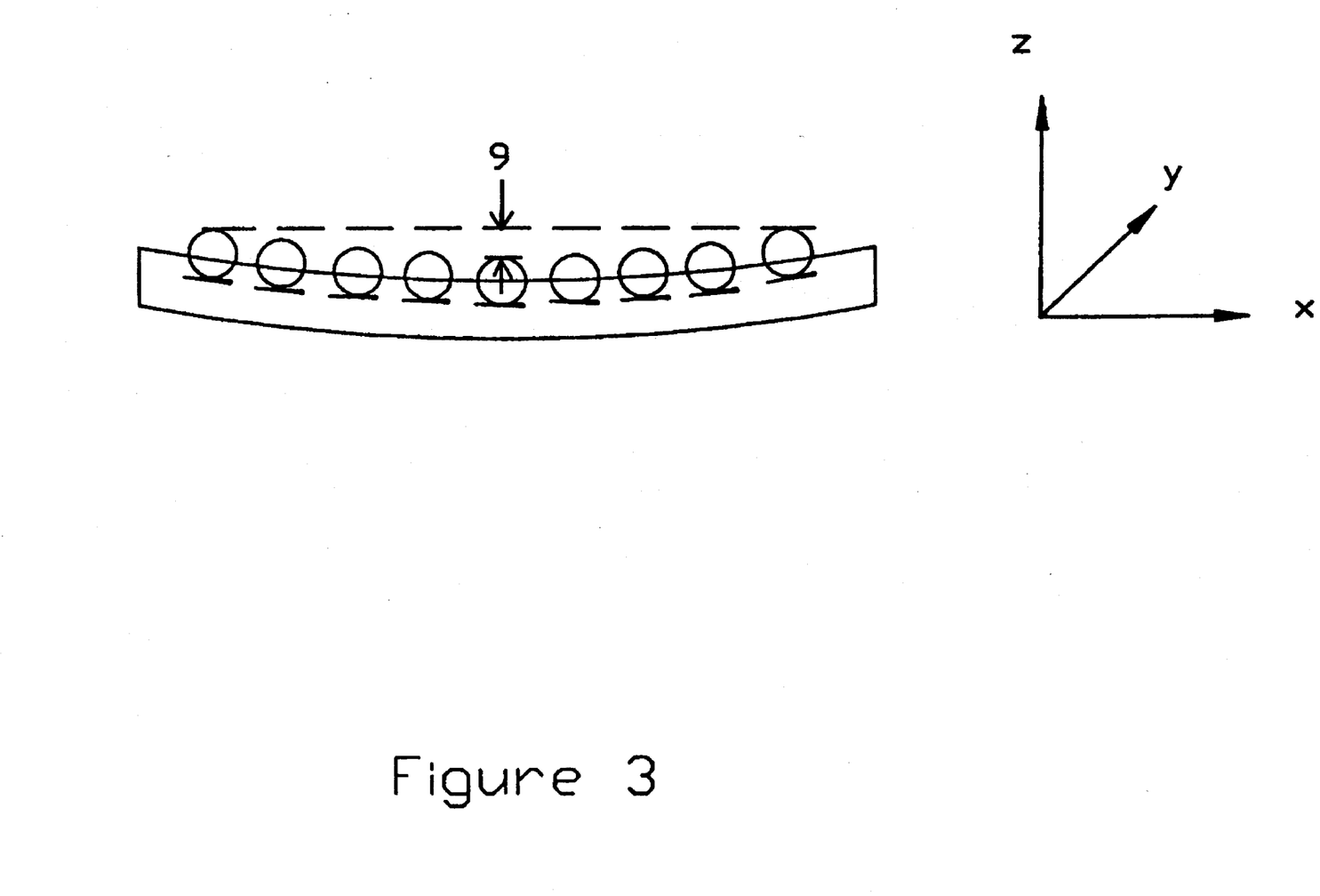
FIG. 3 shows the front view of a bga with a warped substrate.

FIG. 3 shows a plan view of a bga chip with the reference plane determined using the seating plane method. The third point used to determine the seating plane is not visible in this view. The maximum coplanarity, in this example, is at location (9). The coplanarity as a function of position or ball number could be fitted to a best fit surface (plane or higher order curve). The resultant parameters describing this surface can be used to monitor and/or control the process. For example, suppose that the coplanarity as a function of position is fitted to the surface, $$z=ax^2+by^2+c.$$

Then, the process may be considered under control as long as the a and b coefficients remain smaller than predetermined values.

Figure 4:
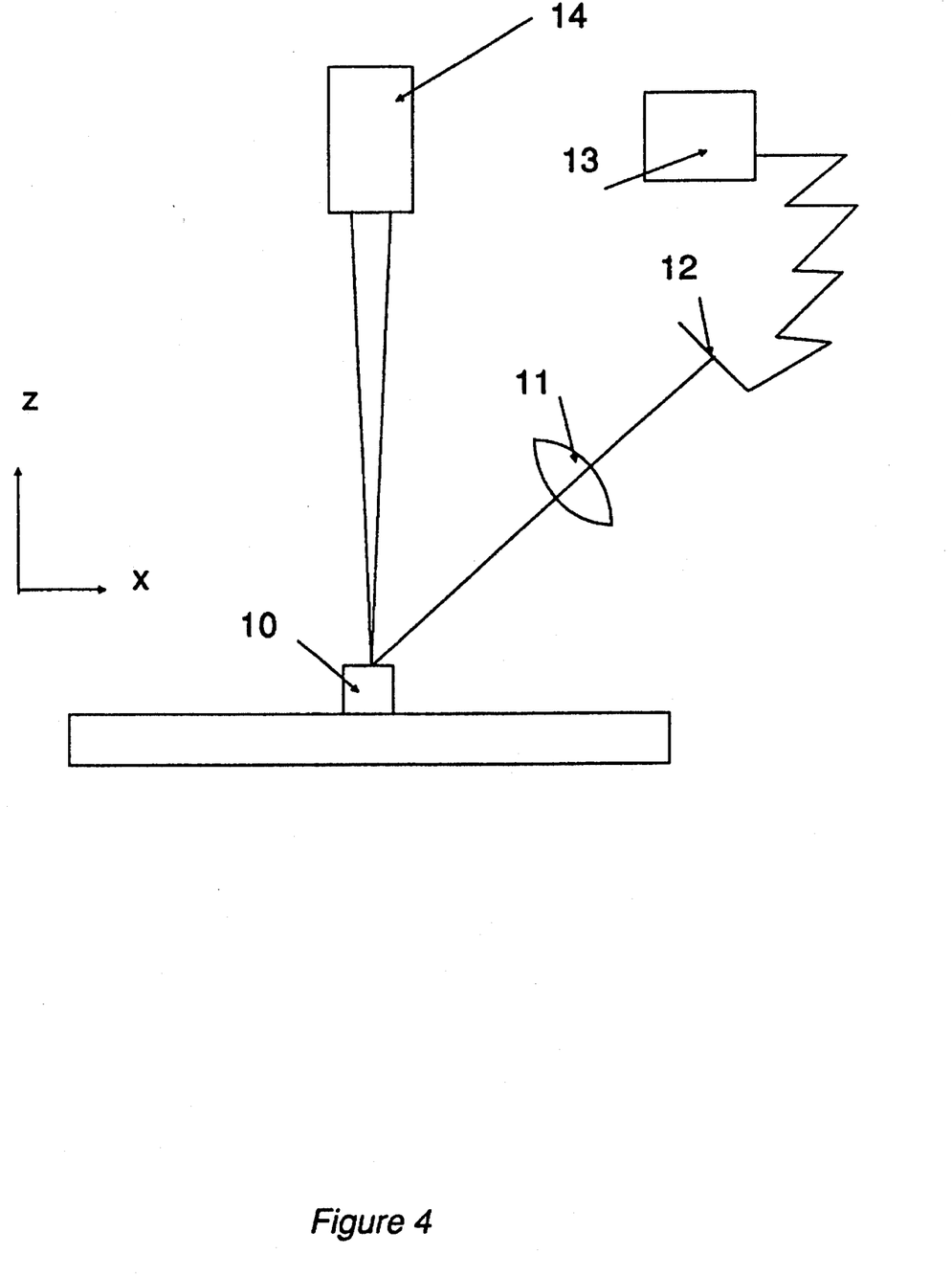
FIG. 4 shows the principal elements of a three dimensional vision system.

A preferred method of measuring the coplanarity of a ball or other object uses three dimensional (3-D) machine vision to determine the height of the object at a given coordinate location. FIG. 4 shows the essential elements of the method. A light source (14) is positioned to illuminate the object (10) at a specific x,y position. The illumination beam is arranged so that it forms a focused spot at the point of impingement on the object (10). The source optics (not shown) are designed to have a sufficient depth of focus so that the size of the light spot at the point of impingement varies inconsequentially within the specified variation of object heights.

The spot is imaged with optics (11) onto an image plane containing a light sensor (12). The sensor is selected for its ability to determine the spot image location on its surface. Such sensors are well known in the art with two examples being charge coupled devices (CCD's) and position sensitive devices (PSD's). Both types are readily available. The image location can be accurately determined with either type of sensor. It is well known that the image location is related, using standard optics, to the location of the light spot on the sample which, in turn, can be used to determine image height. Calibrated processing electronics (13) are used to calculate the height of the object and store the object height with its associated x,y location. By scanning the light source (14) and imaging device consisting of (11) and (12) as a unit, over the entire x-y extent of the object and recording image height at each location, the entire surface can be mapped. Further description of three dimensional machine vision equipment and methods is given in U.S. Pat. No. 5,028,799. Other height measuring techniques, such as laser scanning microscopes and shadow moire, can also be used to calculate height at various locations on the surface. Shadow moire is described in C.-P. Yeh et al.

Figure 5:
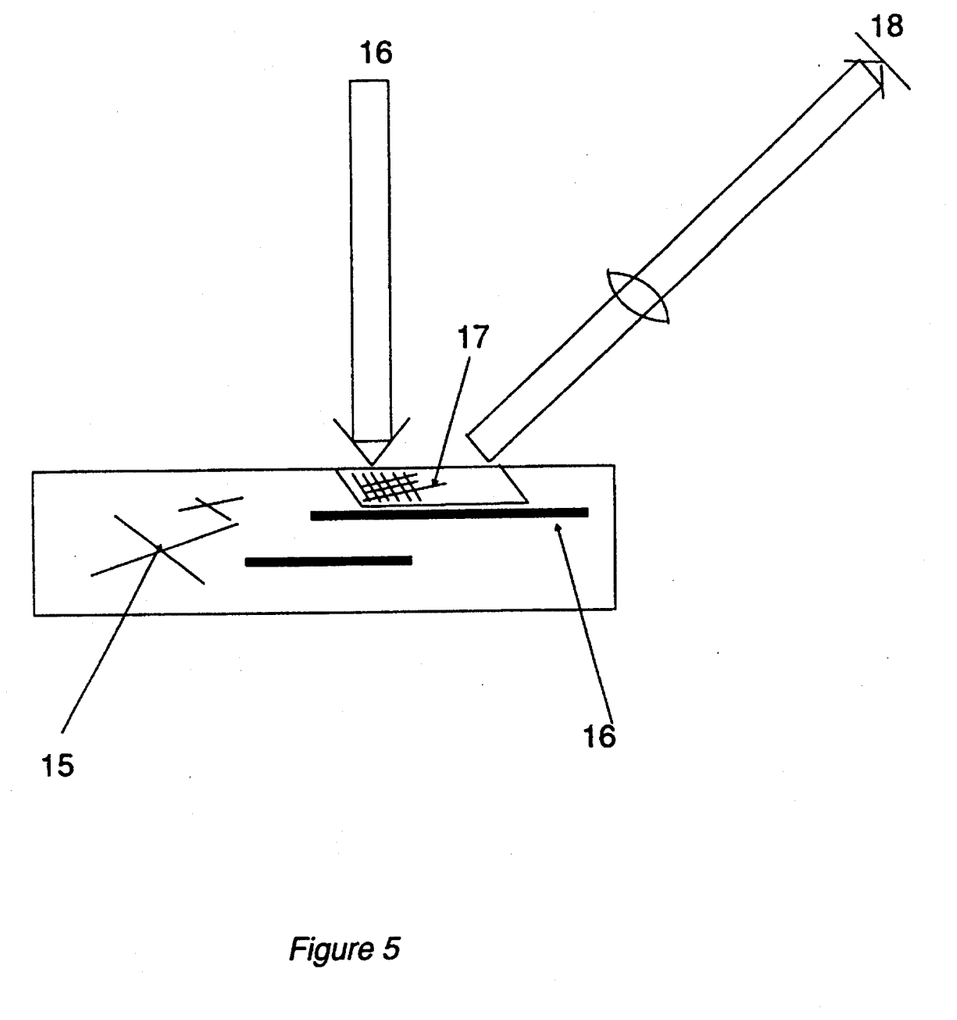
FIG. 5 shows a side view of a translucent or transparent bga substrate with embedded conductive lines and surfaces.

While the principles of measuring coplanarity are well understood, a number of problems associated with the substrate properties may cause difficulty in making the measurement. Several examples are shown in FIG. 5. The substrate (17) may be translucent or partially transparent so that the spot image from the beam (16) is not localized at the substrate surface but distributed through the volume, thus violating one of the measurement conditions. If the substrate is partially transparent and contains embedded conductors (15), conductive planes (16), or other opaque features, the light spot may be formed at the location of such a feature and interpreted by the vision equipment (18) as the height of the substrate at that particular location.

The invention provides a means of reliably and accurately measuring the coplanarity of the substrate and providing a process control means for monitoring substrate quality. The means can be used for process control at the substrate fabrication output station. It can also be placed at the finished part inspection location to inspect the completely assembled bga and still provide necessary control data to monitor substrate quality.

The invention consists of providing fiducial regions at a plurality of locations at or near the bga substrate surface which can be used to accurately determine substrate coplanarity using three dimensional (3-D) machine vision. The fiducial regions permit the 3-D vision equipment to determine unambiguously the substrate surface height in a region localized about the fiducial mark.

The fiducial regions, hereafter referred to as index pads, are designed to have sufficient surface area to be easily detected by the vision equipment. The pads to which the bga balls are soldered will be referred to as signal pads. The index pads are preferably opaque to the incident light so that, referring to FIG. 4, the spot formed by the focused beam from the light source (14) can be easily detected by the optical sensor (12).

Figure 6:
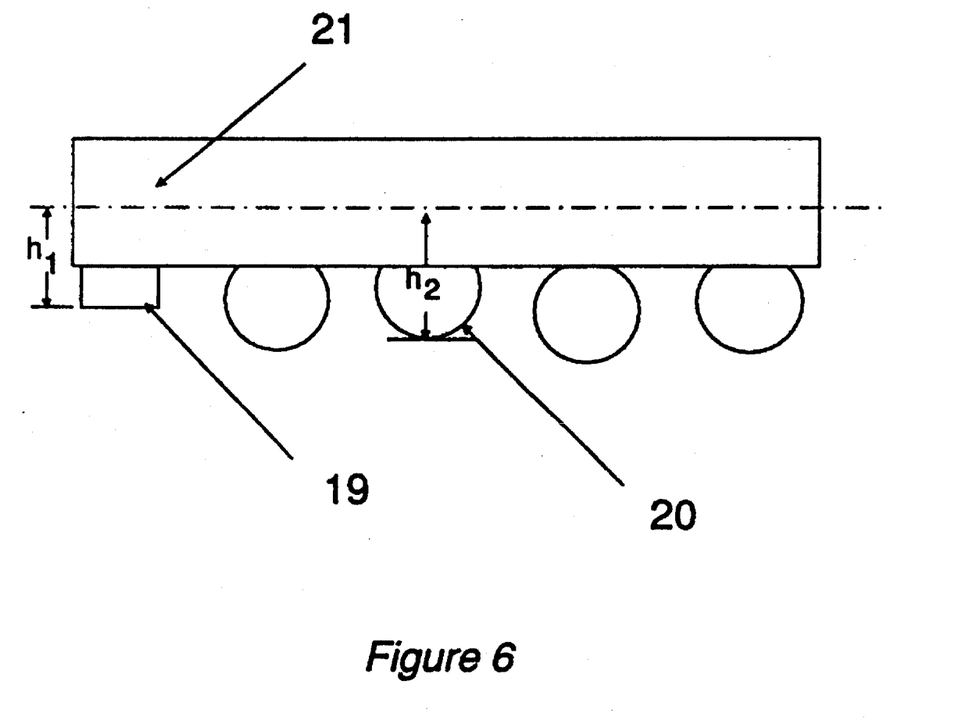
FIG. 6 shows a front view of an idealized bga and defines restrictions placed on index pad height.

The surface of the signal and index pads need not coincide precisely with substrate surface. The surface of the index pads must be positioned relative to the surface of the bga balls in such a way as to avoid causing an interference when the balls are adhered to a printed wiring board. That is, the height, $h_1$, of the index pad (19) in FIG. 6 must be less than the height, $h_2$, of the smallest ball (20). Note that the height, $h_2$, should be taken as the ball height measured after the ball is adhered to a printed wiring board.

A further restriction is placed on the index pad height should the coplanarity be measured at final inspection rather than during in-process inspection. The vision system has a specified height range which it can accommodate, defined as the z-range. This range places a restriction on the maximum extent of $h_2-h_1$ which can be measured and hence a restriction on $h_1$.

Figure 7A:
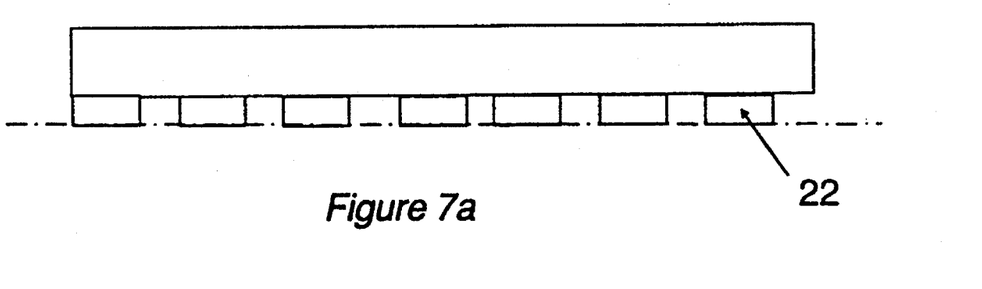
FIGS. 7a–7c show front views of idealized bgas with several variants of index pad height variation with distance.
Figure 7B:
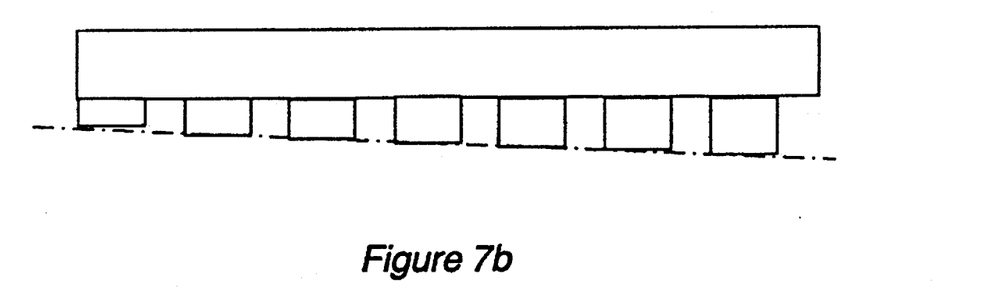
Figure 7C:
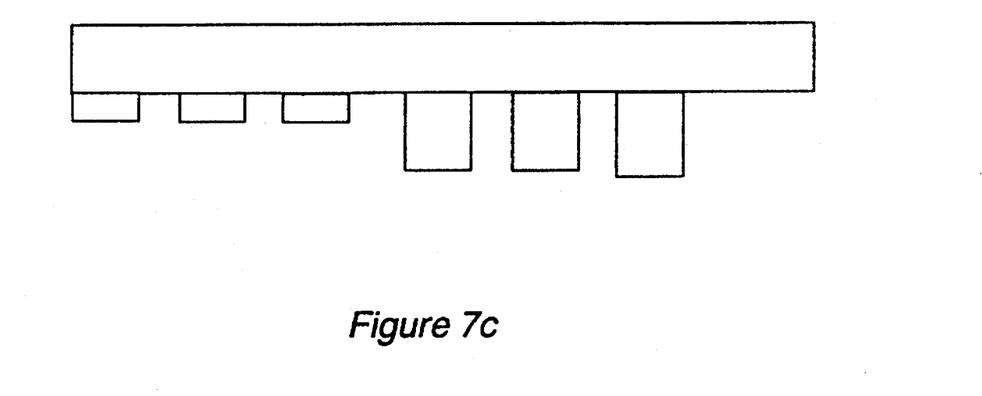

In practice, the index pads may be found to be of constant height, uniformly varying height, or of predetermined known height as shown in examples in FIG. 7. FIG. 7a shows index pads (22) of nominal constant height below a reference plane. The signal pads would also be of constant height by virtue of the fabrication process. FIG. 7b shows index pads whose height varies linearly as a function of position relative to a reference plane. Note, moreover, that the tips of the index pads still lie in a plane. This might arise as a result of misalignment during the process of embedding the pads in the epoxy substrate. The height of the signal pads, being closely correlated with index pad height, would also be expected to lie in a plane parallel to the plane formed by the index pads. In FIG. 7c, the index pad heights vary in a known fashion over the surface by predesign or as determined by studying and/or analyzing the process of fabricating the substrate. These systematic variations may arise from the peculiarities of the particular fabrication process. In this case there may be a position dependent correction factor that can be applied to the index pad heights to determine the corresponding signal pad heights.

The most important parameter to control, for successful bonding of the bga to the printed wiring board, is the coplanarity of the bga balls. Because the balls are attached to signal pads, it is only important, in determining coplanarity, to know the substrate height at the signal pad locations rather than at general points on the surface.

There must be a close correlation-between the heights of the index pads and the signal pads since the objective of having the index pads is to provide a means of inferring the heights of the signal pads. This can be accomplished by properly designing the fabrication process. One means of accomplishing this is to use unused signal pads as index pads. A second means is to construct index pads by plating additional material on existing signal pads using photoresist masking techniques to avoid plating signal pads which are not dedicated to indexing. In this case, the reference plane, (21), in FIG. 6 would be the plane in which the signal pads reside.

There are innumerable ways of creating and disposing the index pads over the substrate only several of which will be detailed here. However, other embodiments which generally follow the concepts outlined here are considered to be covered by this disclosure.

Figure 8:
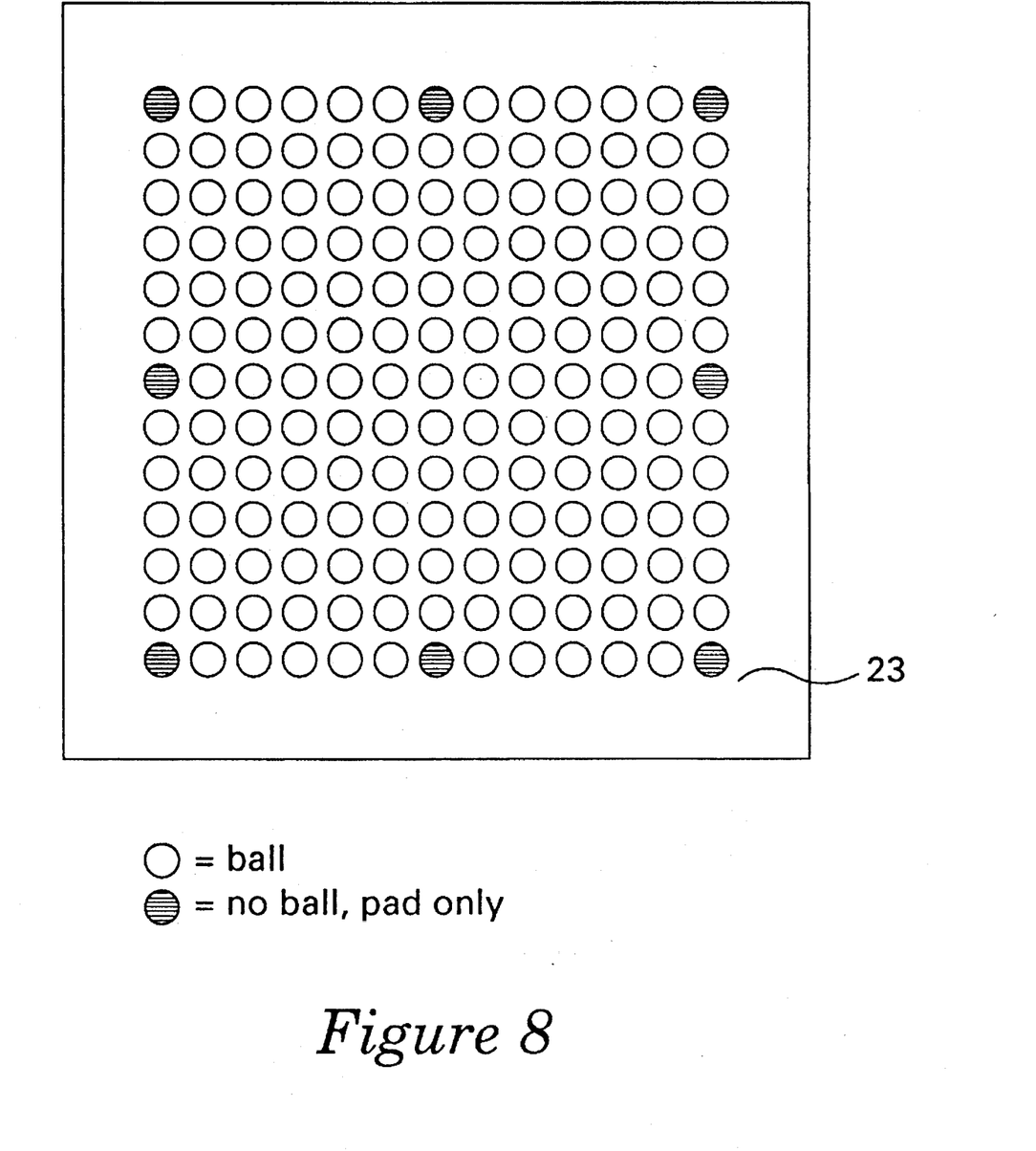
FIG. 8 shows a plan view of a bga with index pads selected from the totality of signal pads.

Three approaches serve to illustrate the method. In the first two cases, the index pads are selected from the totality of pad on the substrate. In third case, the index pads are fabricated separately from the signal pads. In case one, the index pads are selected from the total number of available pads and dedicated for measurement purposes. That is, they are empty signal pads. They are distributed over the substrate surface so that their height provides a measure of the variations in signal pad coplanarity. FIG. 8 provides an example of this case. The darkened circles (23) represent the index pads.

In case two (no figure shown), the index pads are again selected from the total available pads and may include all the pads. however, they do not have a dedicated usage. Rather, their surface height is measured prior to addition of the bga balls. Once the height is measured and analyzed for inspection purposes, any or all of the index pads may be used as interconnection (signal) pads. An advantage of this embodiment is that it provides a large number of index pads by which to determine the coplanarity and still permits all pads to be used for interconnection purposes.

Figure 9:
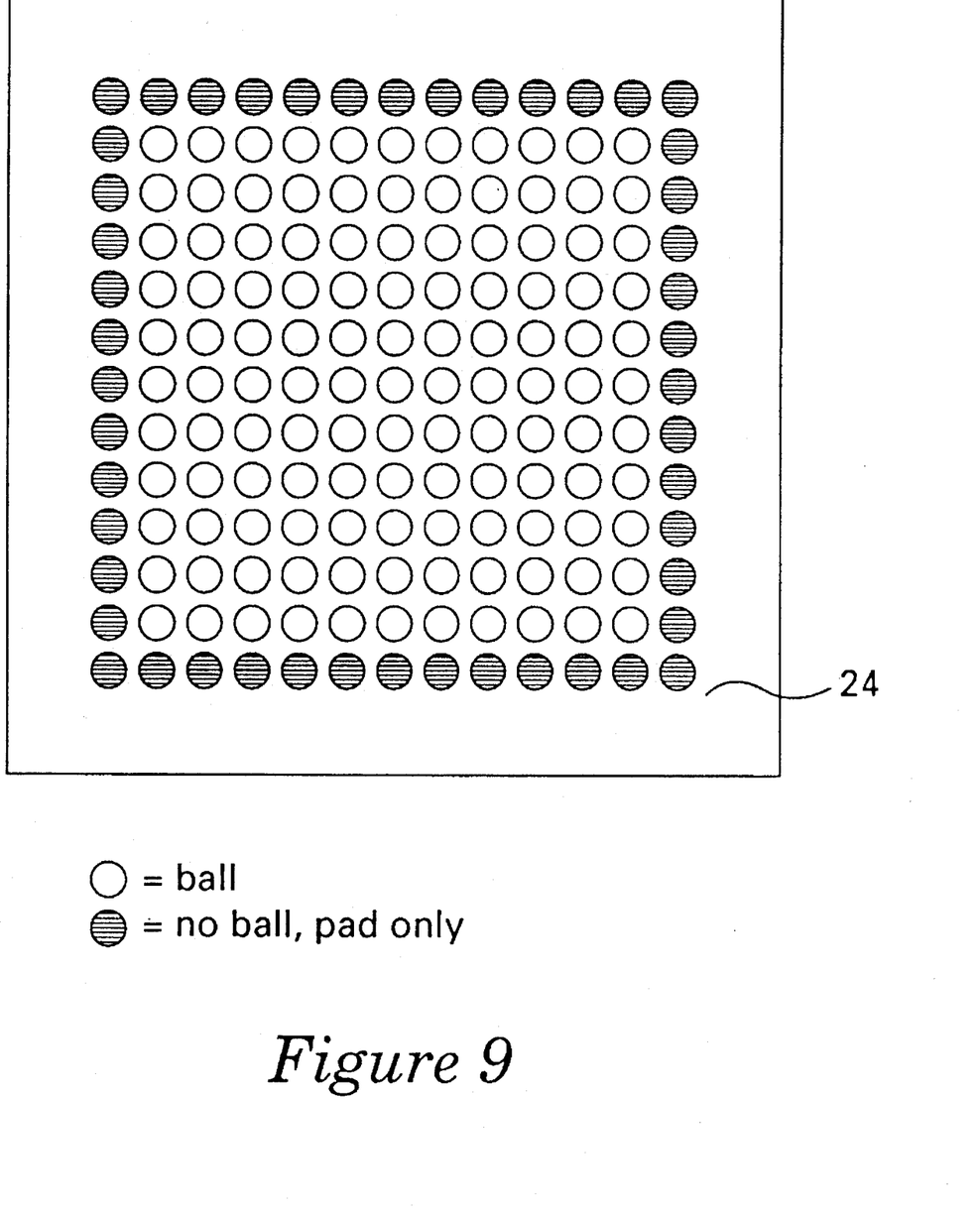
FIG. 9 shows a plan view of a bga with index pads created in addition to signal pads.

In case three, the index pads are created separately from the signal pads. They may be formed in a separate process cycle, be disposed geometrically over the surface independently of the signal pads, and have a different geometrical shape. As mentioned earlier, however, the process for fabricating the index pads should be tightly correlated with the process for fabricating the signal pads so that the height of the latter is representative of the former. FIG. 9 shows one embodiment of this case. The darkened circles (24) represent the index pads. Note that it is an advantage to use separately formed index pads if 3-D sensor z-range is likely to be a problem since the height of the index pad may be chosen to satisfy z-range constraints of the 3-D sensor.

Figure 10:
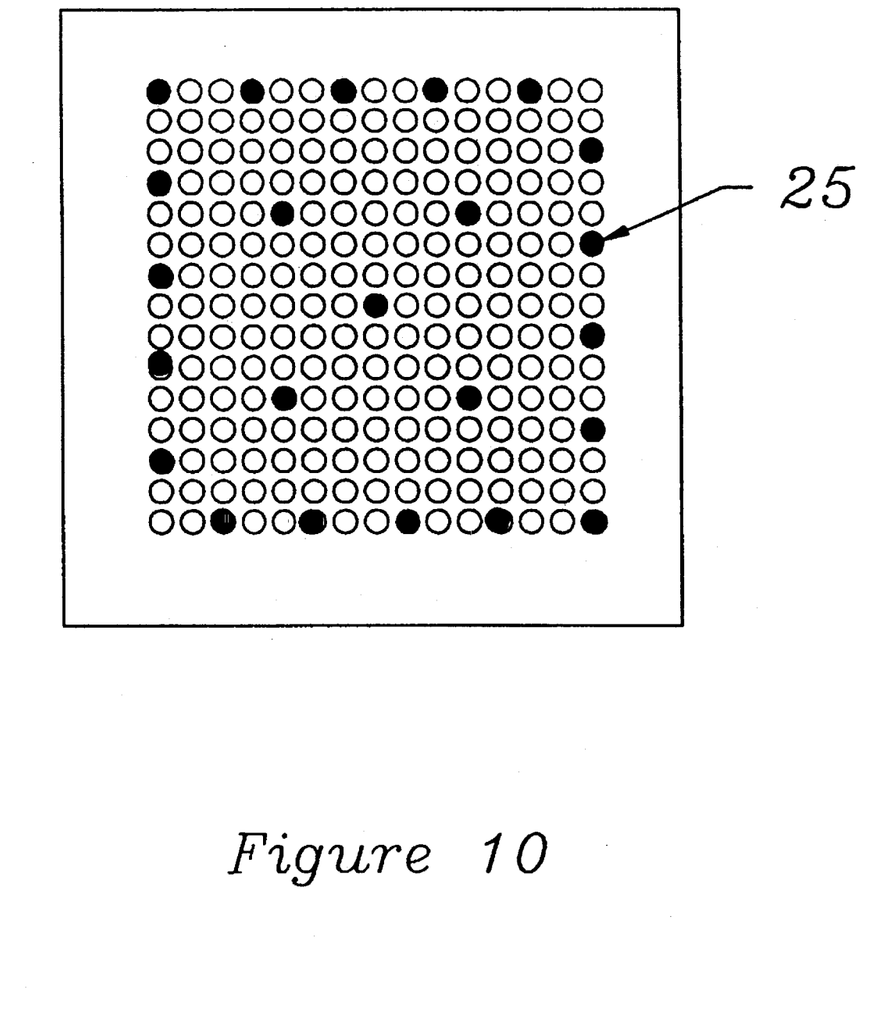
FIG. 10 shows a plan view of a bga with a pattern of index pads.
Figure 11:
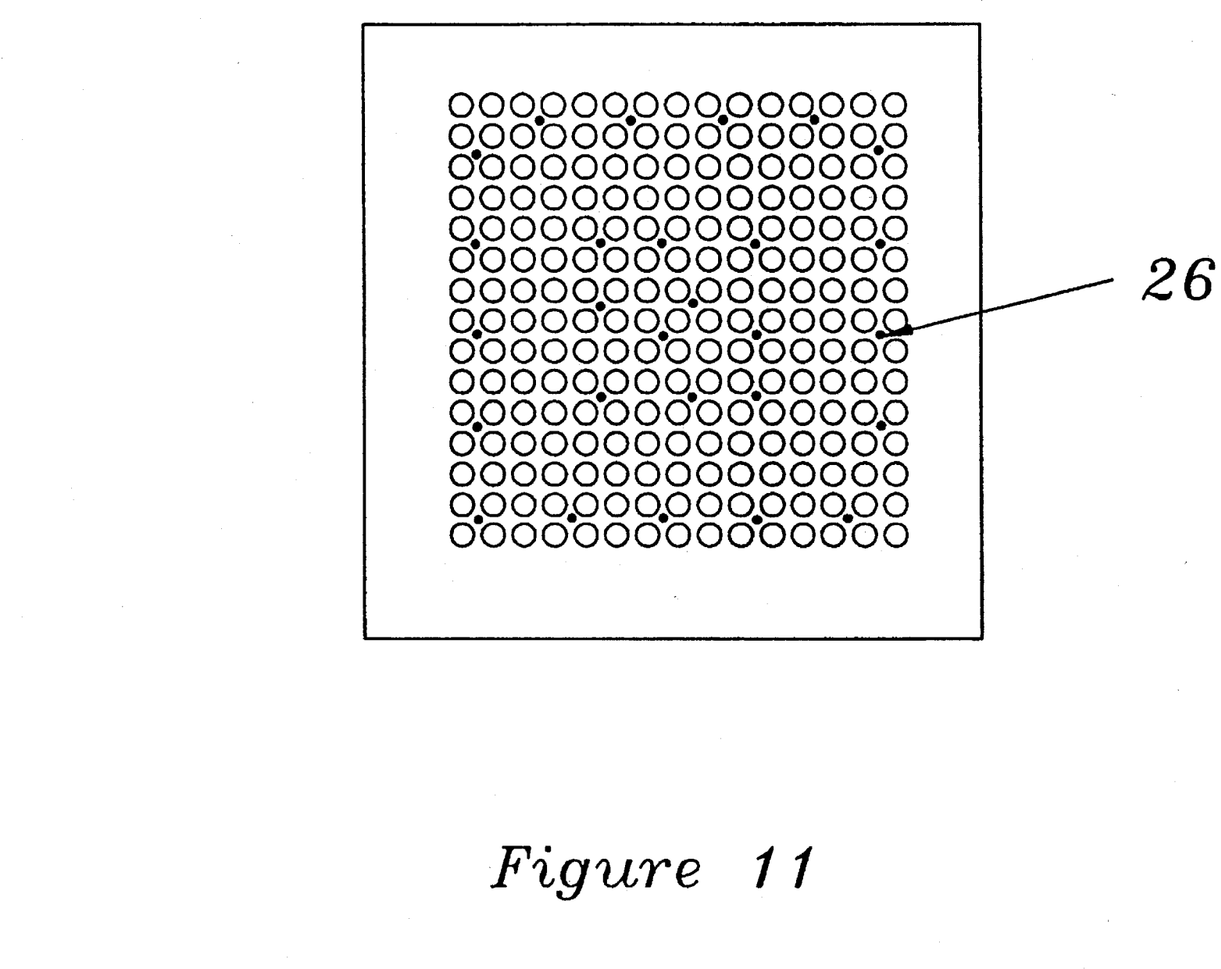
FIG. 11 shows a plan view of a bga with index pads dispersed interstitially.

The layout of the index pads must allow the height of the signal pads over the entire surface to be accurately estimated. Index pads should be disposed in those areas where signal pad height variations are thought to be most likely as well as locations which yield a coplanarity representative of large portions of the substrate. For instance, in one bga process, the epoxy substrate is laminated with a plastic molding compound on the surface opposite the balls. This process tends to warp the substrate edges making the coplanarity along the edges unrepresentative of the coplanarity of the rest of the area. In this instance, the index pads should be disposed along the edges to measure the warpage. Index pads should also be located at inner regions of the substrate to properly measure coplanarity there. FIG. 10 shows a representative layout of index pads (black circles, 25) with pads being positioned along the edges as well as at representative locations within the array of balls. In this example, empty signal pads are used as index pads. Alternately, index pads fabricated independently from the signal pads could have been used, increasing the number of signal pads available for interconnection. Also, the index pads (black circles, 26) could be disposed in the interstices between the signal pads to conserve area as shown in FIG. 11. It should be clear that these examples illustrate just several of many possible patterns which could have been used.

Index pad height and separation from surrounding signal pads must be carefully controlled to avoid electrically shorting the interconnections. This can be accomplished by careful mechanical design and fabrication. Alternately, the index pads may be produced using opaque, nonconductive material or an opaque, composite structure consisting of a conductor with a nonconductive surface layer. In either case, the index pad height must be closely correlated to the signal pad height.

Ideally, the index pads should be arranged to maximize the speed of inspection and minimize that amount of data that must be collected to achieve a given level of accuracy. For the instances mentioned in the paragraph above, the index pads should be uniformly distributed throughout the array with the remainder disposed along the surface to sample possible substrate warpage.

Figure 12:
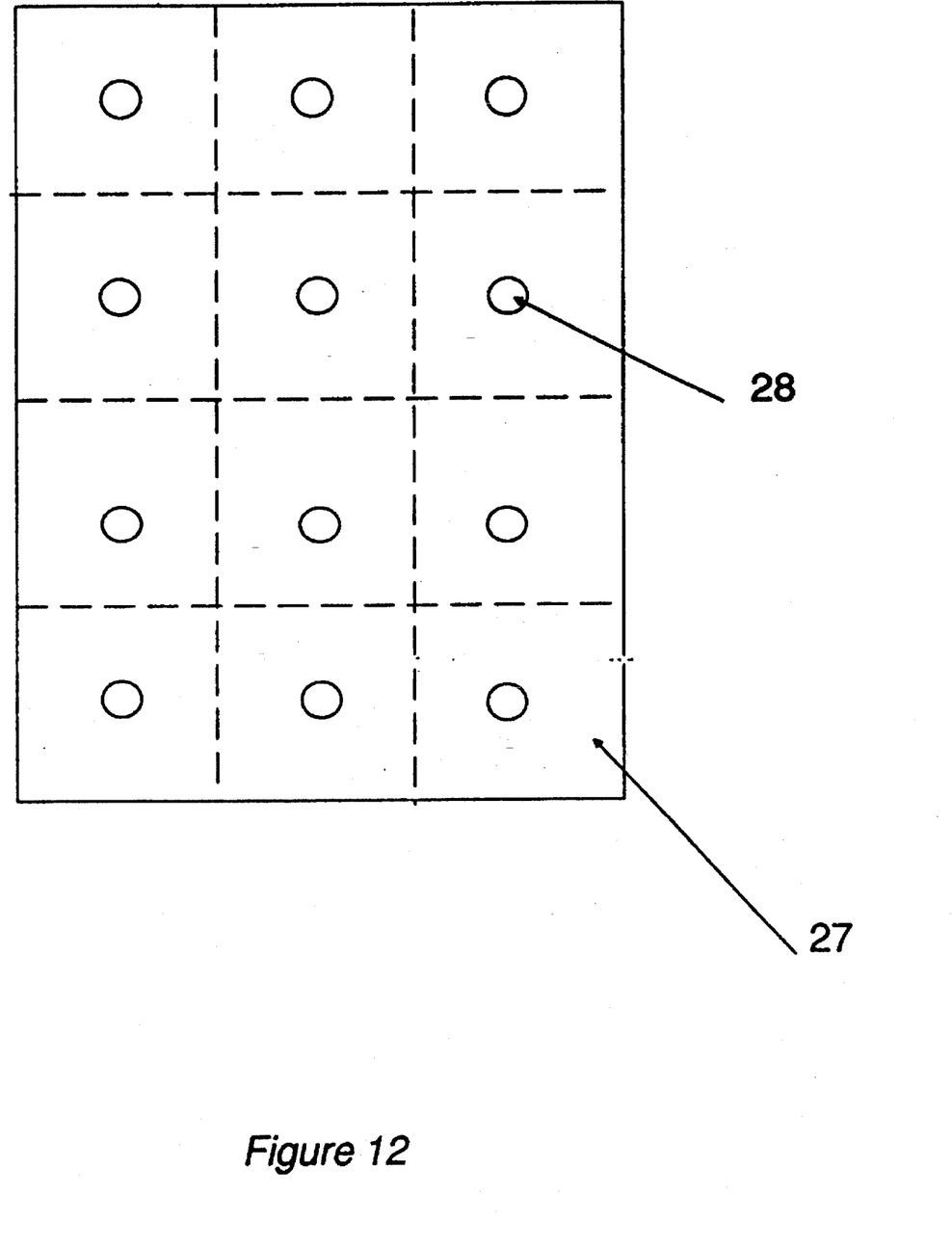
FIG. 12 shows a plan view of an array of laser spot images segmented into a plurality of elements.

It is desirable that each index pad extend over a number of x,y resolution elements to improve the measurement accuracy by providing a number of laser spot samples in the same localized region. With reference to FIG. 12, a resolution element (27) is the area containing a single illuminated laser spot (28). The size of the element depends on the two dimensional spot pitch. While a rectangular element shape is shown in the figure, other shapes may be used. For accurate estimates of the index pad height, there should be in excess of four samples per index pad.

The pad height may be determined by a number of techniques including: averaging of the heights determined from each laser spot element over the extent of the index pad surface, fitting the heights measured on an index pad to a plane, and fitting the height measured on an index pad to a more general surface.

The appropriate method of determining the height of an individual pad depends on pad size, material and other pad characteristics.

Figure 13:
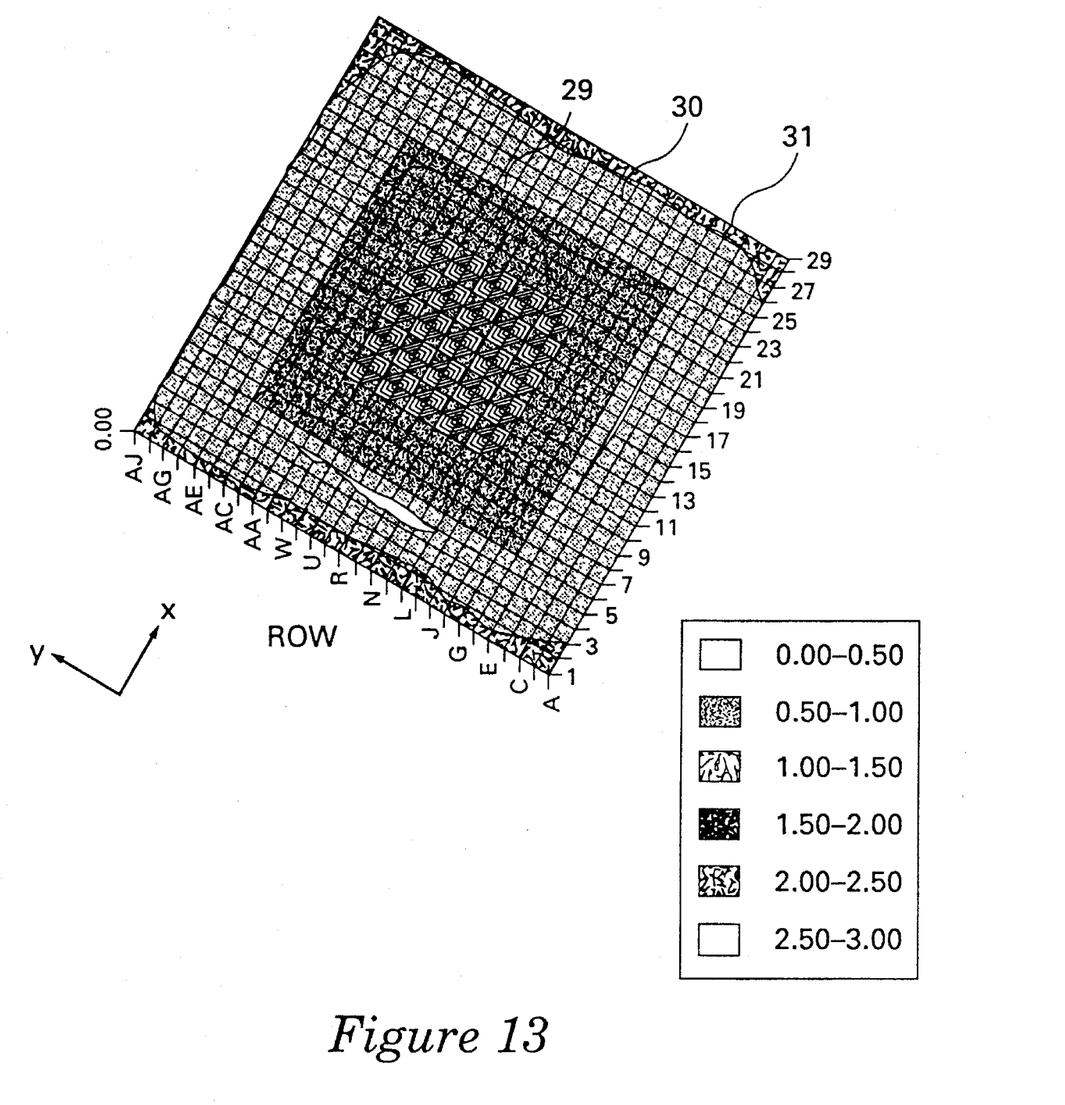
FIG. 13 shows a projection onto an x-y plane of z-heights.
Figure 14:
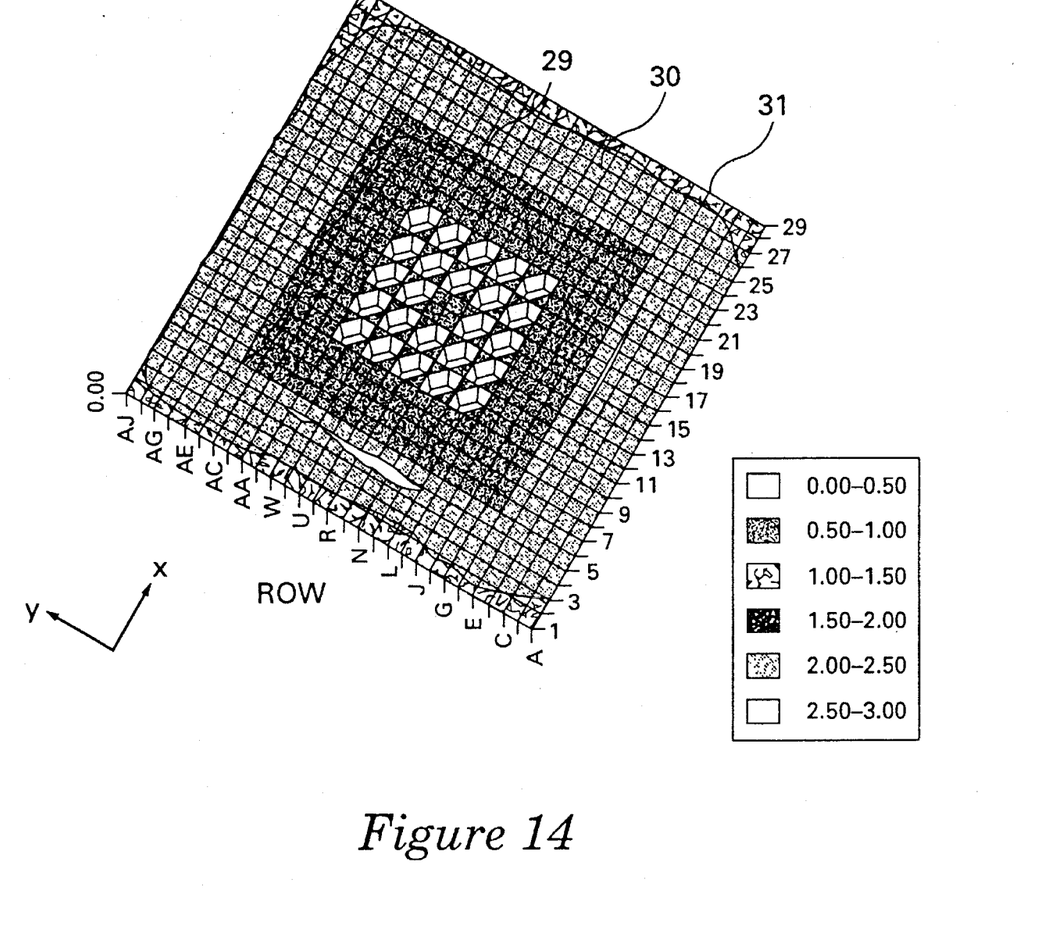
FIG. 14 shows an isometric view of z-heights.

Actual results of coplanarity determination of a bga substrate are shown in FIGS. 13 and 14. FIG. 13 is a projection of the substrate surface onto the x-y plane with each height interval being coded with a different half-tone shade. FIG. 14 shows an isometric view of the substrate. The substrate is one component of a 503 ball bga. Superimposed on the surface plot in FIG. 13 is a two dimensional gird with letters designating the rows (Y direction) and numbers (X direction) designating the columns.

The index pads are located on the substrate at the intersection of the row and column grid lines. For example, the substrate has index pads whose centers lie at A1, C3, C5, E13, etc. The index pads are restricted to the region bounded by the outer periphery and the inner periphery defined by the square with vertices at G5, G23, AE23, and AE5. An additional set of pads is located in the region bounded by L9, L19, AA19, and AA9. A legend shows the height encoding. It is observed that the majority of pads have a height between 0 and 0.50 mils. The height is sampled only at pad locations by properly adjusting the laser pitch and sampling spaces. Because of the sampling technique used, the interpad height variations do not appear in the figure.

The region, (29) which is a darker gray than the region, (30), containing the bga balls, contains a limited number of index pads. This region forms a plateau whose height is 1.50 to 2.00 mils above the coplanarity reference plane.

The coplanarity reference plane from which z-height measurements are made, was obtained by using the (x,y,z) numerical data from each pad. Each pad was sampled in several locations to determine its average z height. These values were then used in a least mean squares regression analysis to determine a plane. The plane was offset in the z direction to aid in obtaining a plot of the coplanarity that was everywhere positive. For the most part, the pads form a surface whose height variation is less than 0.5 mils.

Notice that the coplanarity shows a curl along the outer edges, (31), (dark gray shade) and at isolated regions, (32), on the substrate. The size and extent of the curl can be used to monitor the substrate fabrication process.

What is claimed is:

1. A method for determining coplanarity of substrates for ball grid array, column grid array, and similar surface mount integrated circuit chips, using 3-D optical sensing means, comprising the steps of: providing opaque fiducials as index pads where the heights of said index pads are correlated with signal pad heights in a neighborhood about said index pads; said index pads being opaque to incident radiation from said 3-D optical sensing means; reflecting by said index pads sufficient radiation allow height measurement by said 3-D optical sensing means; disposing said index pads in a prearranged pattern over a domain of array signal pads; restricting said index pads to a predetermined range of heights; measuring the heights of each of at least three said index pads at said index pad coordinate locations; suitably fitting a preselected surface shape to the index pad height and coordinate location data; and calculating the difference in height between each index pad and the preselected surface shape evaluated at the index pad location.

2. A method as defined in claim 1, wherein said index pads are distributed uniformly in regions where, from substrate mechanical design considerations, coplanarity varies slowly with position, said index pads having a denser distribution where the coplanarity varies abruptly; bounding said range of heights of said index pads to a maximum value corresponding to a smallest height of balls of said ball grid array, columns of said column grid array, or elements of other types of arrays; measuring heights of said index pads by said 3-D optical sensing means; said index pads having top surface areas; measures of said index pad heights determining coplanarity at each of the index pad locations by curvefitting a preselected curve shape to the index pad height measurements at each of the grid array element locations, be they ball, column, or other, and calculating the difference in height between each index pad and the preselected surface shape evaluated at the index pad location; avoiding erroneous measurements associated with translucent and transparent substrate materials that lead said 3-D sensor to determine mistakenly that a signal pad surface is located at an embedded conductor line or subsurface location; and avoiding measurement problems associated with substrate surface imperfections having height variations not representative of array substrate coplanarity.

3. A method as defined in claim 1, wherein said index pads are metallic and opaque.

4. A method as defined in claim 1, wherein said index pads are produced separately from the signal pads.

5. A method as defined in claim 4, wherein said index pads are produced separately from the signal pads by addition of material to unused signal pads.

6. A method as described in claim 4, in which the index pads are fabricated from an opaque, nonconductive material.

7. A method as described in claim 4, in which the index pads are fabricated from an opaque, composite structure consisting of a conductive core coated with a nonconductive outer surface layer.

8. A method as defined in claim 1, wherein said index pads are produced separately and located in interstices between adjacent signal pads.

9. A method as described in claim 1, in which the index pads are fabricated from an opaque, nonconductive material.

10. A method as described in claim 1, in which the index pads are fabricated from an opaque, composite structure consisting of a conductive core Coated with a nonconductive outer surface layer.

11. A method as described in claim 1, in which the index pads are identical with the signal pads rather than separately fabricated elements intended solely for use as fiducial pads, which index pads are located at signal pad sites outside of sites occupied by array elements such as bga balls, columns or other.

12. A method as described in claim 1, in which the index pads are identical with the signal pads rather than separately fabricated elements intended solely for use as fiducial pads, which index pads are located at signal pad sites occupied by array elements such as bga balls, columns or other; and determining coplanarity prior to deposition of grid array elements.

* * * * *